(12) United States Patent
Marro et al.

(10) Patent No.: US 7,010,556 B1
(45) Date of Patent: Mar. 7, 2006

(54) ANTENNA TREATMENT METHOD AND SYSTEM

(75) Inventors: Claude Marro, Plouguiel (FR); Wolfgang Tager, Munich (DE)

(73) Assignee: France Telecom SA, Paris (FR)

( * ) Notice: Subject to any disclaimer, the term of this patent is extended or adjusted under 35 U.S.C. 154(b) by 0 days.

(21) Appl. No.: 09/914,362

(22) PCT Filed: Feb. 28, 2000

(86) PCT No.: PCT/FR00/00491

§ 371 (c)(1),
(2), (4) Date: Jan. 3, 2002

(87) PCT Pub. No.: WO00/51234

PCT Pub. Date: Aug. 31, 2000

(30) Foreign Application Priority Data

Feb. 26, 1999 (FR) .................................. 99 02662

(51) Int. Cl.
*G06F 17/10* (2006.01)
(52) U.S. Cl. ..................................................... 708/300
(58) Field of Classification Search ................ 708/300
See application file for complete search history.

(56) References Cited

U.S. PATENT DOCUMENTS 6,115,409 A * 9/2000 Upadhyay et al. ........... 375/144
6,388,513 B1 * 5/2002 Wright et al. ................... 330/2

OTHER PUBLICATIONS

Simmer K. U. et al: "Analysis and Comparison of Systems for Adaptive Array Processing of Speech Signals in a Noisy Environment" (vol. 13, p. 529-532).
Zelinsky R. "Noise Reduction Based on Microphone Array With LMS Adaptive Post-Filtering"—Electronic Letters, GB, IEE Stevenage, vol. 26, No. 24, (Nov. 1990) p. 2036-2037.

* cited by examiner

*Primary Examiner*—D. H. Malzahn
(74) *Attorney, Agent, or Firm*—Lowe, Hauptman & Berner, LLP

(57) ABSTRACT

The ratio of useful-signal power to the power of interference signals at an antenna (ANT) having plural sensors, and at least one sensor is obtained by filtering the antenna output signal with a filter having a transfer function (W(t), W(t, f)) equal to the ratio of two linear functions of the power ($\hat{p}_y(t)$, $\hat{p}_y(t, f)$) at the output of the antenna to the power $\hat{p}_x(t)$, $\hat{p}_x(t, f)$) at the input of the antenna (ANT).

22 Claims, 8 Drawing Sheets

ANTENNA TREATMENT METHOD AND SYSTEM

The present invention relates to antenna systems and methods, in particular to improve the power ratio of useful signal to interfering signals.

The expression "antenna" is construed broadly in the present text: an "antenna" herein is considered apparatus which transmits or receives information-carrying waves. Accordingly the main purpose of an antenna is to retrieve useful information by discriminating against perturbation signals due to noise, interfering sources, reflections etc.

Figure 1:
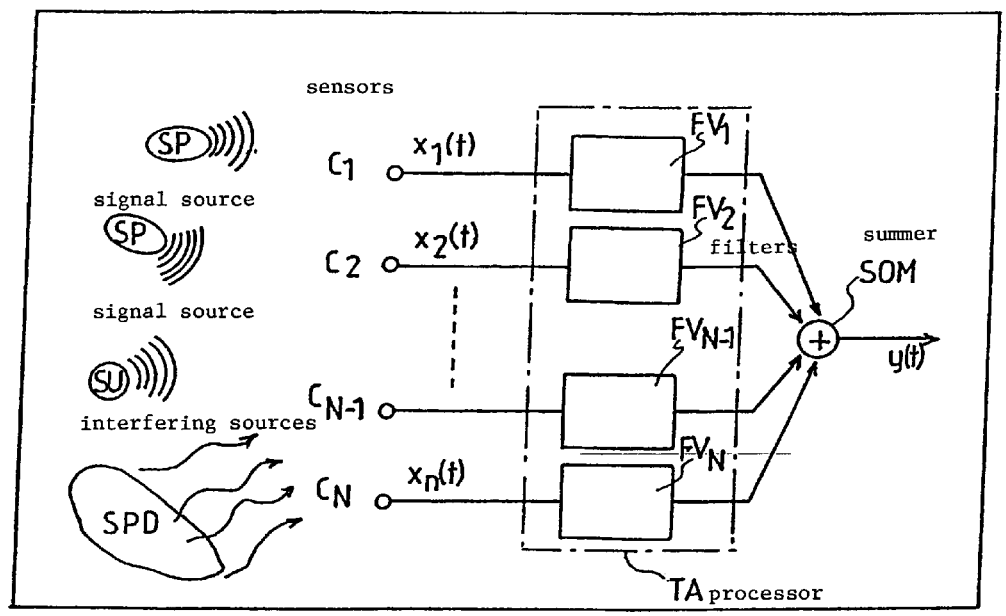

The present invention solely applies to receiving antennas constituted of discrete elements. Such an antenna is shown in FIG. 1. It consists of N sensors $C_1$ through $C_N$ to pick up signals from various sources such as at least one useful signal source SU, interfering sources SP and other more diffuse interfering sources SPD. Each sensor $C_i$(i=1 ... N) has a perturbed output signal $x_i$(t) varying with time t which then is filtered through a channel filter $FV_i$ having a transfer function $a_i$(t), where i=1 ... N, of which the function is to control various antenna features. The set of these filters implements a given directivity to the antenna (for instance the aperture of the main lobe and/or the size of the secondary lobes, rejection in undesired directions etc.). This set of filters also allows pointing the antenna in the direction of the useful signal source.

The outputs of these filters $F_i$ are connected to the corresponding inputs of a summer SOM at the output of which then appears the antenna output signal y(t).

A number of channel filter designs and their applications are known. The design of these filters depends in particular on the geometric positions of the sensors and of the signals to be processed. These filters may exhibit permanently frozen characteristics (as regards the stationary antennas) or characteristics which vary with time (as regards adaptive antennas). With respect to the latter, the algorithms which adapt the filter coefficients over time in general entail a control device appropriate to the particular application. Illustratively an interfering signal may be sampled when the useful signal source SU is inactive. For the sake of clarity, such a control system is omitted from FIG. 1.

The method of the present invention applies to antennas regardless of the processing (fixed channel filtering, constitution of an adaptive channel etc.) of the signal $x_i$(t) from each sensor $C_i$. In such a case the signal processing between acquiring the signals x(t) and the antenna output must be ignored and the TA element must be considered a black box wherein a so-called antenna processing operation takes place.

In the present specification, the expression "antenna processing" therefore connotes all antenna processing methods, in particular those known to-date.

In this field of application, antenna performance may be limited. In particular the reduction in interference coming for instance from the interference sources SP or SPD may be found inadequate. In general such performance is measured in the form of a value which is a characteristic element of antenna efficiency and which is called the signal-to-noise gain of the antenna. The expression "noise" denotes all the interfering signals that the antenna is expected to reduce and in that case the signal-to-noise ratio will be the power ratio of useful signal to interfering signals.

The method of the invention is applicable to all technical fields wherein the antenna is or might be used. A non-exhaustive listing of such fields is given below:

1. Acoustic pickup by acoustic antennas such as:
   acoustic pickup for work stations (multimedia PC, etc.),
   acoustic pickup while hands remain free when within vehicles,
   acoustic pickup for free-hands telephony,
   acoustic pickup in public places (RR stations, airports etc.),
   acoustic pickup for teleconferencing and visual conferencing,
   acoustic pickup for movie houses and the media (radio, TV, for instance sports journalism or concerts, etc.).
2. The antenna receives radio waves (radio communications, remote detection, etc.),
3. Reception by sonar antenna (submarine imaging, remote sensing, etc.),
4. Multi-pickup processing used for biomedical signals (EEG, ECG, biomedical imaging, etc.).

The objective of the present invention is to reduce the interfering signal components that were not removed by the antenna and consequently to improve the power ratio of useful signal to interfering signals.

The techniques of the state of the art relating to processing at the antenna output, which also are called post-processing, include those of multi-sensor acoustic detection. In the present specification, such a description shall be limited, however, in order to explain them appropriately, their overall algorithm shall be discussed adequately in the light of acoustic detection of speech used in the multimedia stations (PC communications etc.) which is the context of the authors of the cited literature.

Combining a network of microphones with post-processing was first described by J. B. Allen in 1977 in an article in J. ACOUST. SOC. AM. vol. 62, #4, pp 912–915 under the title "Multimicrophone signal processing technique to remove reverberation from speech signals". Its purpose was eliminate reverberation signals during remote acoustic detection in a reverberating ambience. Said article describes acoustic detection implemented by two microphones and full processing based on the correlation function and carried out in the frequency domain.

In PROC. ICASSP-88, pp 2578–2581, New York, USA, 1988, R. Zelinksi extended this technique in an article entitled "A microphone array with adaptive post-filtering for noise reduction in reverberant rooms" to acoustic detection using a larger number of pickups. K. U. Simmer in an article of September 1992 in Proc. ISSSE-92, Paris, France, titled "Time delay compensation for adaptive multichannel speech enhancement" proposed a "Wiener filtration" transfer function of post-processing.

The analysis below allows describing the set of these methods, namely in relation to FIG. 2.

In this antenna system, the interfering speech signals $x_i$(n) are received by an antenna consisting of N microphones $C_1$ through $C_N$ and they are described by the general expression $$x_i(n)s(n-\pi_{hi})+n_i(n), \text{ where } i=1 \ldots N \quad (1)$$

where "s" denotes the speech signal from the source SU and $n_i$ denotes the noise signal from the sources SB and received by the sensor $C_i$. Because of the procedure of "digital signal processing", n represents the time index in discrete time. The symbol $\pi_{hi}$, is the delay due to signal propagation from the source SU to the sensor $C_i$. In order to bring back into phase of each signal $x_i$(n), that is, to point the antenna toward the source SU, the antenna must be pointed in the direction of the desired speaker using the channel filter $FV_i$ having the transfer function $r_i$(n) and transmitting a signal $v_i$(n) which is given by the following formula $$v_i(n)=r_i(n)*x_i(n), \text{ where } i=1 \ldots N \quad (2)$$

and where * denotes the convolution product.

The signals from the channel filters $FV_i$ through $FV_N$ are transformed into the frequency domain to allow processing them therein subsequently. Upon completion of this transformation, these signals are denoted $V_1(f)$ through $V_N(f)$ and are summed in the summer SOM and averaged in the averaging device MOY. The signal $Y(f)$ from the averaging device MOY is subjected in the filter W to filtering of transfer function $W(f)$.

The filter W which is optimal in terms of the mean square error exhibits a transfer function denoted $W_{opt}(f)$ which is obtained by minimizing the mean square error between the desired signal s and the estimated signal ŝ. According to the Wiener-Hopf equation and only assuming perfectly bringing back into phase the useful signal $s(n)$, the general formula for the Wiener filter in the frequency domain is as follows $$W_{opt}(f) = \{\Phi_{ys}(f)\}/\{\Phi_{yy}(f)\} \quad (3)$$

where $\Phi_{yy}(f)$ is the spectral power density of the signal $s(n)$ at the output of the averager MOY and $\Phi_{ys}(f)$ is the interspectral power density of the signals $y(n)$ and $s(n)$.

This equation for the optimal filter is based on the useful signal $s(n)$ and the mean noise at the output of forming the channel $\bar{n}$ assuming the signal $x_i(n)$ incident on each sensor $C_i$ is represented by the sum of the useful signal $s(n)$ and the noise $n_i(n)$, that each of the noises $n_i(n)$ and the useful signal $s(n)$ are decorrelated, that the spectral power densities of the noises $n_i(n)$ are identical at each microphone, i.e. $\Phi_{nini}(f) = \Phi_{nn}(f)$, $\forall i=1 \ldots N$, that the noises $n_i(n)$ are decorrelated between sensors, namely $\Phi_{ninj}(f)=0$ for $i \neq j$, and that lastly the input signals $x_i(n)$ have their phases perfectly brought into phase relative to the useful signal $s(n)$.

The expression for the transfer function follows:

$$W_{opt}(f) = \frac{\phi_{ss}(f)}{\phi_{ss}(f) + \phi_{\{nn\}avg}(f)} \quad (4)$$

where $\Phi_{ss}(f)$ and $\Phi_{\{nn\}avg}(f)$ are resp. the spectral power densities of the useful signal $s(n)$ and of the noise $n(n)$ at the channel formation output.

These two values $\Phi_{ss}(f)$ and $\Phi_{\{nn\}avg}(f)$ are required to calculate $W_{opt}(f)$ but are initially unknown and therefore estimating them poses a problem. For all the methods discussed in the state of the art, $\Phi_{ss}(f)$ and $\Phi_{\{nn\}avg}(f)$ are estimated from the signals received at the different sensors. For instance assuming the noises at each microphone are uncorrelated, it will be possible to make an estimate of the useful-signal spectral density $\Phi_{ss}(f)$ from the interspectral power densities $\Phi_{vivj}(f)$ of the signals $x_i(n)$ and $x_j(n)$ at the outputs of the sensors $C_i$ and $C_j$ brought back into phase by means of the filters $FV_i$ and of the delay compensator CR. The estimating means of the spectral and interspectral power densities distinguish the different procedures of the state of the art.

As regards the above assumed input signals, the spectral values $\Phi_{vi,vi}(f)$ and $\Phi_{vi,vj}(f)$ can be written as $$\Phi_{vi,vi}(f) = \Phi_{ss}(f) + \Phi_{nn}(f) \quad (5)$$

$$\Phi_{vi,vj}(f) = \Phi_{ss}(f), i \neq j \quad (6)$$

One way to estimate $W_{opt}(f)$ is to use an average respectively of these spectral and interspectral power densities at the denominator and numerator:

$$\hat{w}(f) = \frac{\left\{\frac{2\gamma}{N(N-1)}\right\} \sum_{i=1}^{N-1} \sum_{j=i+1}^{N} \hat{\Phi}_{vivi}}{\left\{\frac{1}{N}\right\} \sum_{i=1}^{N} \hat{\Phi}_{vivi}} \quad (7)$$

where $\gamma(.) = Re(.)$ or $\gamma(.) = |.|$

The use of the module operator or real part $\gamma(.)$ is valid in view of the magnitude to be estimated in the numerator, namely $\Phi_{ss}(f)$, which must real and positive. The notation "^" indicates a (statistical) estimate of the applicable value.

The estimating operator $\hat{W}(f)|_{\gamma(.)=Re(\ )}$ was proposed by R. Zelinski (see above cited article) being implemented in the time domain. In the 1992 Simmer article, estimating and filtering are carried out in the frequency domain. $\hat{W}(f)|_{\gamma(.)=Re(\ )}$ then is an extension to an arbitrary number of sensors of the double sensor processing described by Allen in 1977. Indeed the above eq. (7) when viewed in terms of algorithms represents two methods of the Wiener filter, namely $\hat{W}(f)|_{\gamma(.)=Re(.)}$ and $\hat{W}(f)|_{\gamma(.)=|.|}$.

Figure 2:
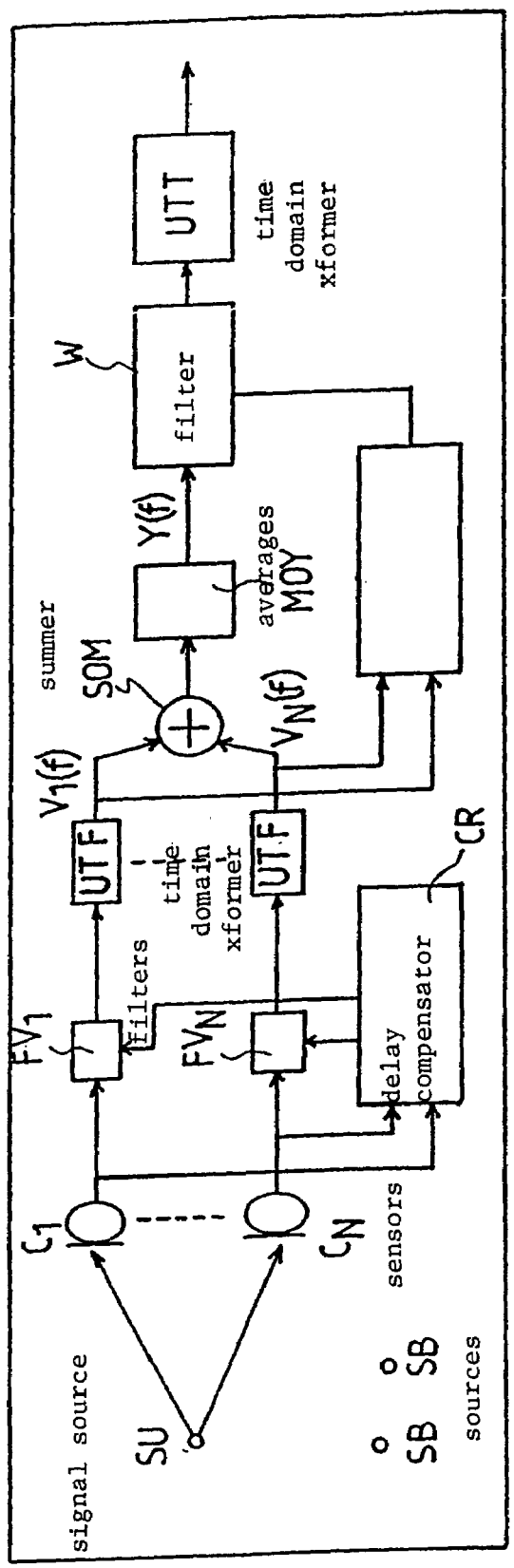

FIG. 2 shows the spectral magnitudes required to estimate the filter W, that is the densities $\Phi_{vi,vi}(f)$ and $\Phi_{vi,vj}(f)$ in turn must be estimated based on the signals transmitted from the sensors $C_1$ through $C_n$ that were processed by the channel filters $FV_1$ through $FV_N$. In practice, when post-filtering in a real ambience and in the presence of speech signals, an estimate is required to assure continuity of the non-stationary nature of such signals while also providing acceptable estimate quality.

Among the drawbacks of the methods of the state of the art is that post-processing entails estimating a large number of spectral values. To calculate the function $W(f)$ requires estimating $N(N-1)/2$ interspectral power densities and the calculation of its denominator requires estimating N spectral power densities, that is, a total of $N(N=1)/2$ spectral values will be required. In the case of an antenna constituted of 9 microphones, 45 spectral values must be calculated in the form of 36 interspectral power densities and 9 spectral power densities.

The estimate of the spectral power density $\Phi_{ss}(f)$ of the useful signal $s(t)$ is carried out using the average of the interspectral power densities of the microphone signals after they have been brought back into phase. In the presence of interference, these must obey the assumption that they are uncorrelated between sensors in order that this function $\Phi_{ss}(f)$ be accurate. In fact, however, the source of localized noise and also certain reflections are signals coherent from one sensor to another. As a result, these interfering sources cannot be discriminated by the operation $\hat{\emptyset}_{vi,vj}(f)$ and the estimate of $\Phi_{ss}(f)$ shall be affected (eq. 6 above will not apply). This error shall be the larger the smaller the signal-to-noise ratio. This bias added to the function $\Phi_{ss}(f)$ is the coherent component of the interspectral density of the noise power, which shall be the larger that the noise shall be higher. Two consequences are the result: performance degradation as regards interference reduction and degradation of the useful signal. Accordingly the overall system of antenna+postfiltering may perform more poorly than the antenna alone.

In addition to causing the bias in the estimate of the function $\Phi_{ss}(f)$, the real features of the interferences also entail restriction on the system performance even in the absence of a useful signal. At those instants when the useful signal s(n) is inactive, the post-processing $\hat{W}(f)$ theoretically should wholly remove the noise because in such a case the interspectral power densities $\hat{\emptyset}_{vi,vj}(f)$—in this instance being the interspectral power densities of the noises alone—should therefore be zero. In fact however this result is not obtained, again because the random nature of the interferences transcends the assumption above.

Accordingly it is the objective of the present invention to propose an antenna methodology allowing resolving the problems entailed in the state of the prior art.

For that purpose a method of improving the ratio of useful signal-to-noise signals is characterized in that the signal from said antenna is filtered by a filter of which the transfer function equals the ratio of the linear functions of signal power at the antenna output to the power of the signal(s) transmitted by the sensor(s) to the input of said antenna.

Advantageously said transfer function equals the ratio of the antenna output signal power to the signal power(s) fed by the sensors to the input of said antenna.

In another feature of the invention, the method consists in estimating the signal power at the antenna output and the power(s) of the signals fed by the sensor(s) to the antenna input.

To that end, and in a first variation of implementation, the signal(s) transmitted by the antenna sensor(s) is/are used to estimate the power(s) fed by the sensor(s) to the input of said antenna.

In another variation, the signals transmitted by the antenna pickups are used to estimate the power of the signal(s) fed by the sensors to said antenna's input after the signals have been processed in a processing unit of said antenna.

Moreover the present invention relates to an antenna processing technique consisting in transforming, into the frequency domain, the, or each, signal transmitted by at least one sensor, in filtering the, for each, signal after said transformation, in summing the signals each obtained following filtering, and in transforming into the time domain the summed output signal.

In one feature of the present invention, said method is characterized in also consisting in filtering the post-summing signal using a filter of which the transfer function equals the ratio of two linear functions of the power of the signal at the summer output to the power of the signals at the output(s) of said transformation units into the frequency domain.

Advantageously the transfer function is equal to the ratio of the power of the signal at the summer output to the power of the signal(s) fed by said transformation unit(s) into the frequency domain.

Advantageously this method estimates the signal power at the antenna output and the power of the signal(s) transmitted by the sensors at the antenna input.

In another feature of the invention, the method of estimating the power of the signal(s) fed by the sensor(s) to the antenna input is determined by taking the mean of the estimated spectral power densities of the signal(s) transmitted by the sensor(s).

In another feature of the invention, the power of the summer's output signal is ascertained by calculating the estimated spectral power density of this signal.

In yet another feature of the invention, said estimates are carried out by recursive exponential smoothing.

The present invention also relates to an antenna system including an antenna fitted with at least one sensor, said system being designed to improve the power ratio of useful signal to interference signals in said antenna. This system is characterized in that it further includes a filter filtering said antenna's output signal and exhibiting a transfer function which equals the ratio of two linear power functions of the antenna's output-signal power to the power of the signal(s) fed by the sensor(s) to the antenna input.

Advantageously said transfer function equals the ratio of the antenna's output-signal power to the power(s) of the signal(s) transmitted by the sensor(s) to the antenna input.

Advantageously said system also includes estimating units to estimate the power of the signal at the antenna output and the power of the signal(s) fed by said sensor(s) to the antenna input.

Said estimating unit estimating the antenna input power will process one, several, or the signals respectively transmitted by one, several or the sensor of said antenna.

Said estimating unit processes the or several signals transmits the output signals of an antenna processing unit based on the particular signals transmitted by said antenna's sensors.

The invention also relates to an antenna system comprising a frequency-domain transformation unit applied to the, or each, signal transmitted by at least one sensor, furthermore a channel filter filtering in the frequency domain the output signal of this transformation unit, a summer to sum the signals transmitted by said channel filters and a time-domain transformation unit for the output signal of said summer.

The above antenna system is characterized in that it comprises—between the summer and the time-domain transformation unit—a filter of which the transfer function equals the ratio of two linear functions of the power of the signal at the summer output to the power of the signal(s) transmitted by said frequency-domain transformation unit.

Advantageously said filter's transfer function equals the ratio of the power at the summer output to the power of the signal(s) transmitted by said frequency-domain transformation unit.

Said antenna system includes estimating units to estimate the power of the signal at the summer output and the power of the signal(s) at the outputs of said frequency-domain transformation units.

Said estimating unit estimating the power of the signal(s) fed by the sensor(s) to the antenna input will form the average of the estimated spectral power densities of the signal transmitted by the sensor(s).

Said estimating unit estimating the power at the summer output is given by the estimate of the spectral power density of this signal.

Advantageously said system includes means whereby said estimates are carried out in recursive manner by exponential forgetting smoothing.

The above cited features of the invention and further ones are elucidated in the description below of an illustrative implementation and in relation to the attached drawings.

Figure 3:
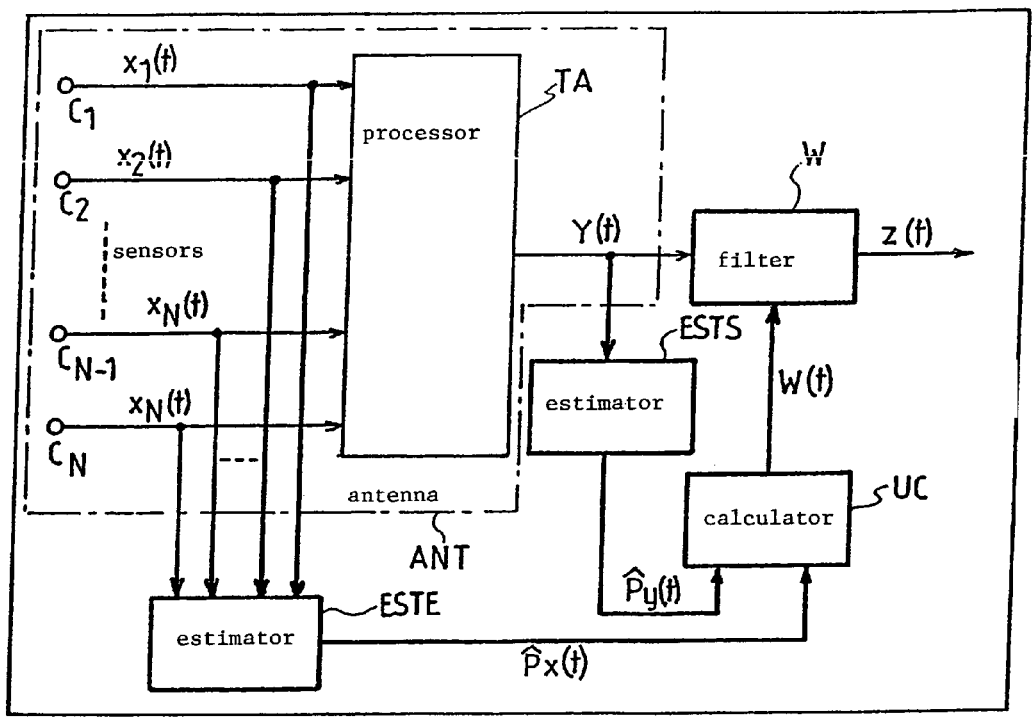
Figure 4:
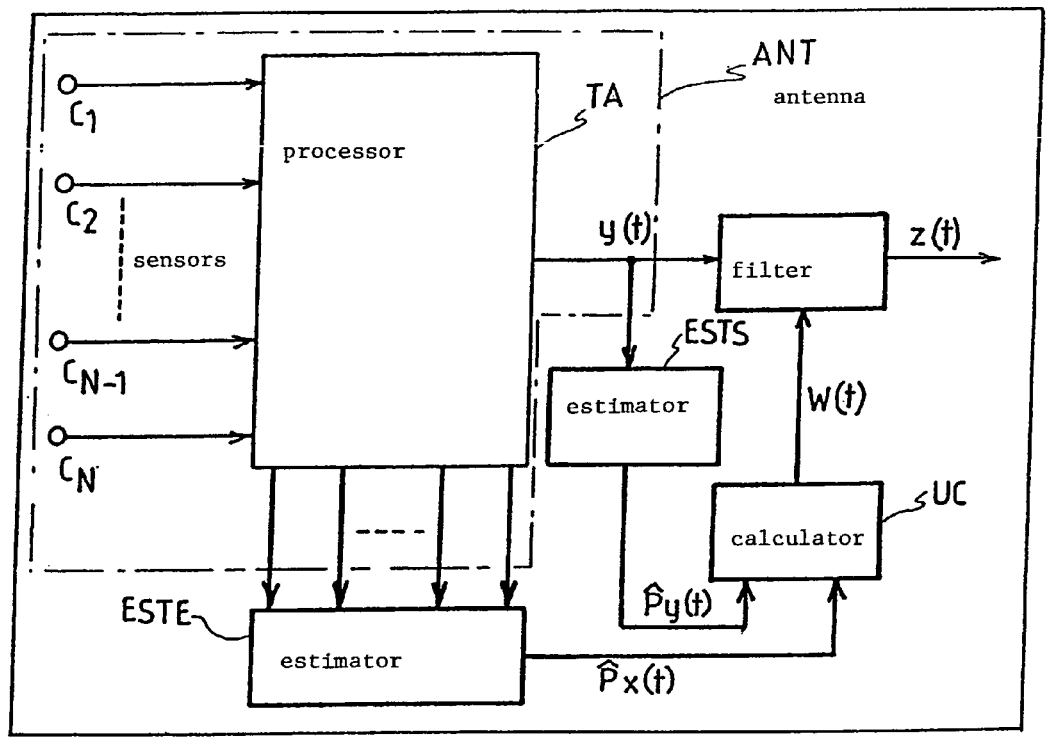
Figure 5:
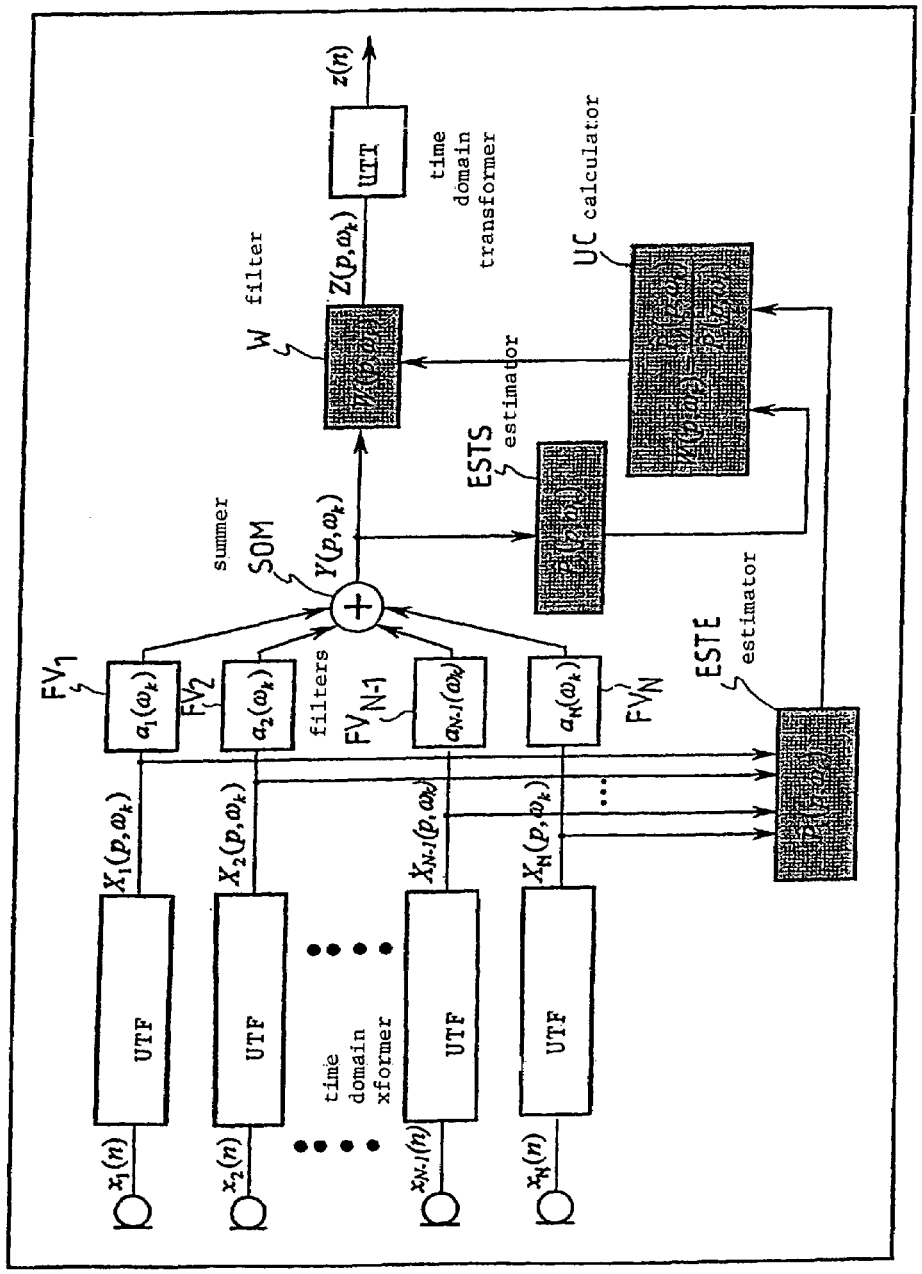
Figure 6:
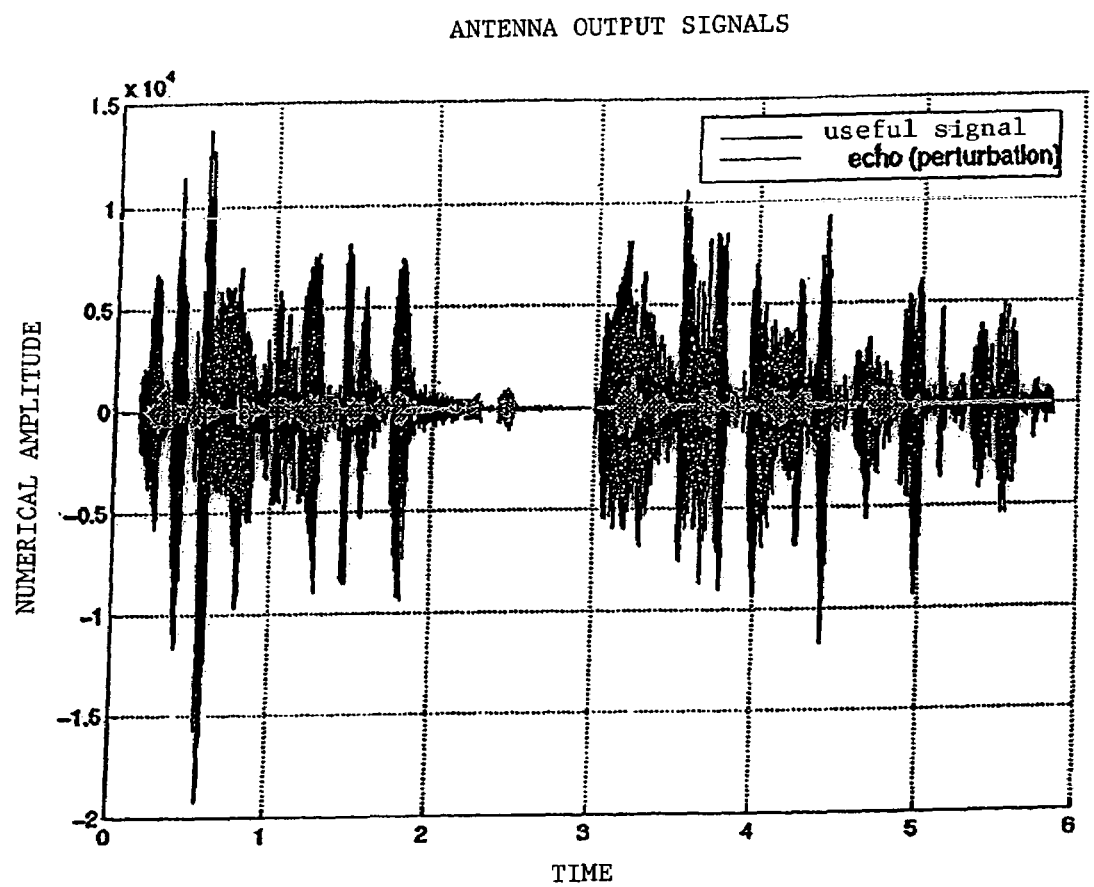
Figure 7:
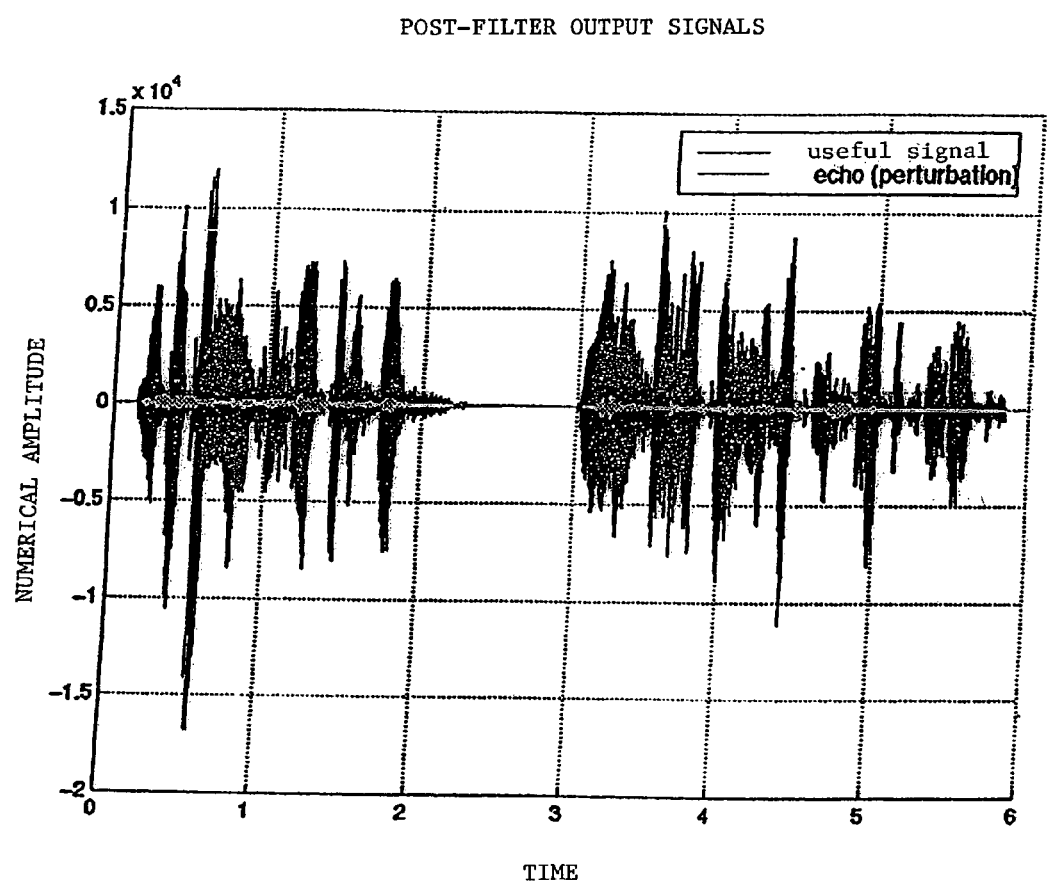
Figure 8:
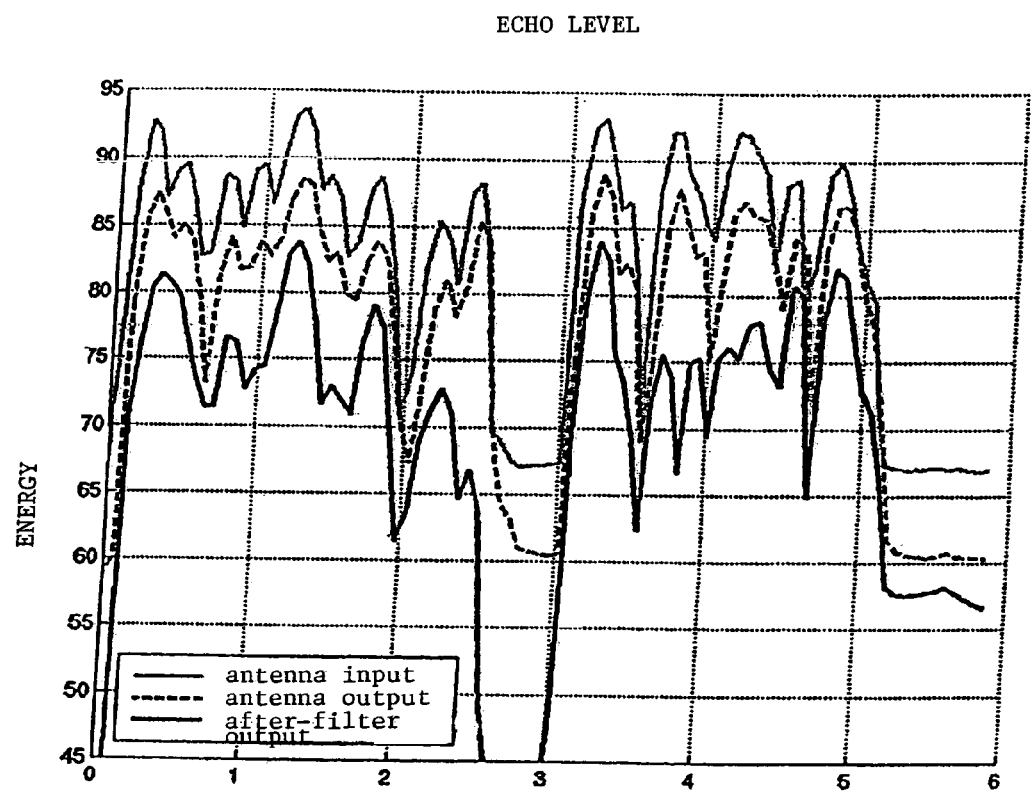

FIG. 1 is a summary schematic of an antenna in the sense of the present specification, FIG. 2 is a summary schematic of an antenna system provided with a post-filter of the state of the art, FIG. 3 is a summary schematic of a first embodiment of an antenna system provided with a post-filter of the present invention, FIG. 4 is a summary schematic of a second embodiment of an antenna system provided with a post-filter of the present invention, FIG. 5 is a summary schematic of a third embodiment of an antenna system provided with a post-filter of the present invention, FIG. 6 is a display of the time-dependent useful-signal amplitudes at the output of an antenna lacking the post-filter of the invention, FIG. 7 is a display of the time-dependent amplitudes of the useful and interference signals at the output of a post-filter used in the manner of the invention, and FIG. 8 is a plot showing the time-dependent interference signal levels at the antenna input, at the antenna output and at the post-filter output.

FIG. 3 shows a summary schematic of an antenna system designed to implement the method of the present invention. This system consists of an antenna ANT which itself consists of a plurality of sensors $C_1$ through $C_N$ of which the output signals $x_1(t)$ through $X_N(t)$ are fed to an antenna processing unit TA that shall implement an antenna output signal $y(t)$.

The shown system includes a post-filtering unit PF which shall apply post-filtering to the signal $y(t)$ and of which the transfer function $W(t)$ in the invention equals the ratio of two linear functions F and G of the power $\hat{p}_y(t)$ at the output of antenna ANT and of the power $\hat{p}_x(t)$ at the input of the antenna ANT which are each estimated by estimating units ESTS and ESTS.

The general statement of the two functions F and G are as follows:

$$F\{\hat{p}_x(t),\hat{p}_y(t)\}=\alpha(t)\hat{p}_x(t)+\beta(t)\hat{p}_y(t) \qquad (8)$$

$$G\{\hat{p}_x(t),\hat{p}_y(t)\}=\gamma(t)\hat{p}_x(t)+\eta(t)\hat{p}_y(t) \qquad (9)$$

and the transfer function $W(t)$ is given by:

$$W(t) = \frac{F\{\hat{p}_x(t), \hat{p}_y(t)\}}{G\{\hat{p}_x(t), \hat{p}_y(t)\}} \qquad (10)$$

$$= \frac{\alpha(t)\hat{p}_x(t) + \beta(t)\hat{p}_y(t)}{\gamma(t)\hat{p}_x(t) + \eta(t)\hat{p}_y(t)}.$$

The transfer function is calculated by a UC unit and is fed to the post-filtering unit PF.

Be it noted that the method of the present invention can be carried out in the frequency domain. The post-filter function $W(t,f)$ then shall be calculated for each frequency component by means of the following relation:

$$W(t, f) = \frac{F\{\hat{p}_x(t, f), \hat{p}_y(t, f)\}}{G\{\hat{p}_x(t, f), \hat{p}_y(t, f)\}} \qquad (11)$$

where $\hat{p}_x(t,f)$ and $\hat{p}_y(t,f)$ resp. are the frequency-domain powers $\hat{p}_x(t)$ at the input and $\hat{p}_y(t)$ at the output and where $W(t,f)$ represents the post-filter $W(t)$ in the frequency domain.

In the discussion below, the functions $F\{\hat{p}_x(t), \hat{p}_y(t)\}$ and $G\{\hat{p}_x(t), \hat{p}_y(t)\}$ are assumed respectively equal to the output and input powers $\hat{p}_y(t)$ and $\hat{p}_x(t)$, that is, $$F\{\hat{p}_x(t),\hat{p}_y(t)\}=\hat{p}_y(t) \qquad (12), \text{ and}$$

$$G\{\hat{p}_x(t),\hat{p}_y(t)\}=\hat{p}_x(t) \qquad (13).$$

This post filtering OF applies a transfer function $W(t)$ of the invention to the signal $y(t)$, where $W(t)$ equals the ratio of the power $\hat{p}_y(t)$ at the output of the antenna ANT to the power $\hat{p}_x(t)$ at the input of the antenna ANT, and where said powers are each estimated by the ESTE and ESTS estimating units, $$W(t)=\{\hat{p}_y(t)\}/\{\hat{p}_x(t)\} \qquad (14).$$

When operating in the frequency domain, the post-filter function $W(t,f)$ then will be calculated by the following relation $$W(t,f)=\{\hat{p}_y(t,f)\}/\{\hat{p}_x(t,f)\} \qquad (15)$$

where, as already mentioned above, $\hat{p}_x(t,f)$ and $\hat{p}_y(t,f)$ represent, in the frequency domain, the input power $\hat{p}_x(t)$ and the output power $\hat{p}_y(t)$ and where $W(t,f)$ represents the post-filter $W(t)$ in this frequency domain.

In such mathematics, a value $A(t,f)$ in the frequency domain represents the same value $\alpha(t)$ in the time domain at the time t for the frequency f. It is known that when a signal passes from the time domain into the frequency domain, an observation duration is required. Therefore the value $A(t,f)$ is known at instant t but its calculation may require a duration of which the magnitude is determined by the field of application of the method of the invention.

The estimate of the antenna output signal power $\hat{p}_y(t)$ can be carried out in many different ways depending on the particular applications of the method of the invention. With time denoted by t, the estimate of the antenna output power $\hat{p}_y(t)$ is an instantaneous power value which therefore is time-varying and which is permanently estimated based on the signal $y(t)$. In a particular application, a shorter or longer time of integration will be required depending on how stationary the signals in use will be.

Be it noted that the time variable t may be discrete or continuous.

The above description of estimating the antenna output power $\hat{p}_y(t)$—or $\hat{p}_y(t,f)$—also applies to estimating the antenna input power $\hat{p}_x(t)$—or $\hat{p}_x(t,f)$. The difference relating to estimating the output power $\hat{p}_y(t)$—or $\hat{p}_x(t,f)$—consists in the multi-sensor feature of the antenna input: a single sensor, or only a few sensors, or all sensors (which is the case being discussed), may be used to estimate the antenna input power $\hat{p}_x(t)$—or $\hat{p}_x(t,f)$.

In the light of algorithms, post-filtering is implemented using one of the two latter equations and based on estimated antenna input and output powers $\hat{p}_x(t)$ and $\hat{p}_y(t)$ in the time domain or $\hat{p}_x(t,f)$ and $\hat{p}_y(t,f)$ in the frequency domain. As a result, post-filtering varies in time so to speak synchronously with the power estimates $\hat{p}_x(t)$ and $\hat{p}_y(t)$ or $\hat{p}_x(t,f)$ and $\hat{p}_y(t,f)$. Therefore the function of the resultant post-filter may vary with time only (that is, a time-dependent overall gain $W(t)$) or it may be represented in frequency as $W(t,f)$ (that is, a gain for each time-dependent component). Post-filtering may be carried out as is, however it may also be subjected to linear or nonlinear transformations such as amplitude clipping within an interval of predetermined values in order to preclude aberrational values caused by any errors when estimating $\hat{p}_x(t)$ and $\hat{p}_y(t)$ or $\hat{p}_x(t,f)$ and $\hat{p}_y(t,f)$, or weighting functions, etc.

Post-filtering in the time domain is a convolution. The output signal $z(t)$ of the antenna system of the invention then may be written as $$z(t)=y(t)*W(t) \qquad (16)$$

where * denotes taking the convolution product.

In the frequency domain, this operation is a mere multiplication. Therein the signal z(t,f) at the output of the post-filter W may thus be written as $$z(t,f)=y(t,f)W(t,f) \tag{17}$$

Such filtering can be carried out using various procedures and taking into account the particular application and the antenna processing (i.e., time, frequency, analogue, digital processing etc.). This stage leads to attaining the processing output signal z(t)—(with prior transfer back of z(f) into the time domain if post-filtering is performed in the frequency domain).

It may be appropriate to use signals generated within the antenna processing apparatus TA itself in order to estimate the input power. For instance this case may apply to antennas for which some sensors are assigned to one frequency band (in this case filtering is carried out within the very antenna processing for each of such sensors). If post-filtering is intended to be applied to this frequency band only, the signals at the outputs of filters incorporated in the antenna processing TA may be used for such a determination.

Illustratively FIG. 4 shows another embodiment of an antenna system which also makes use of the method of the present invention. This antenna system differs from the preceding embodiment in that the estimate of the input power $\hat{p}_q(t)$ carried out in the time domain or $\hat{p}_q(t,f)$ carried out in the frequency domain (where the index q distinguishes between the estimates of the input powers $\hat{p}_x(t)$ and $\hat{p}_x(t,f)$ is carried out using signals directly transmitted from the sensors $C_1$ through $C_N$) by means of a given number of these signals generated within the very antenna processing unit TA. More specifically, among the J signals available within the antenna processing, only one signal or only several signals or all signals may be used to estimate the input power $\hat{p}_q(t)$ or $\hat{p}_q(t,f)$.

The estimated input power $\hat{p}_x(t,f)$ may be calculated using the average of the N spectral power densities of the signals each appearing at the sensors $C_1$ through $C_N$. In the same manner, the output power $\hat{p}_y(t,f)$ can be calculated using the spectral power density of y(t). Consequently the method which is an objective of the present invention at most entails calculating N+1 spectral values instead of N(N+1)/2 such values in the prior art. For instance as regards a 9-sensor antenna, 10 estimates of spectral power densities will be calculated in lieu of 36 calculations of interspectral power densities and 9 calculations of spectral densities of the prior art.

Another advantage of the present invention is that is not based on estimating the spectral density of the useful signal, as a result of which a bias problem in estimating the interspectral power density of the useful signal $\phi_{ss}$ (f) will not arise.

Another advantage is that the method of the invention is not based on the intersensor features of the interfering signals. In the prior art, as already mentioned, the noise interspectral densities must be zero in order that the post-filter can effectively reduce noise.

The case of a localized interfering source will now be illustrated. It is assumed that its signal is incident on the antenna at a direction other than that from the useful source and that accordingly the antenna attenuates this signal. This signal being coherently incident on all sensors, then the procedures of the prior art will attenuate it only using post-filtering as carried out in the manner of the present invention because of the very attenuation the antenna applies to this signal. By its algorithmic nature, the method of the invention is robust with respect to the random nature of the interferences because only their energy components are taken into account in the method.

As regards the prior procedures, the interspectral power densities estimated at the input are used to estimate the spectral power density of the useful signal. As a consequence it is mandatory to use the output signals of the delay compensating filters (these are the $FV_i$ filters of FIG. 2 which achieve the antenna pointing toward the useful source). As regards the method of the invention, and because the power of the input signal is estimated directly (e.g., spectral power densities) there is no need to use the channel signals which have been brought back into phase and the estimates can be carried out directly at the sensor outputs.

Immediately below an illustrative application of the method of the present invention is described for the frequency domain. In this instance the antenna system is that shown in FIG. 5.

Each signal x(n) transmitted by a sensor $C_i$ where i=1 . . . N is conventionally subjected by digital signal processing to transformation in the time domain in a unit UTF. Said transform for instance is a short-term Fourier transform (also called sliding time window) which itself may consist of a windowing operation followed by a rapid Fourier transform. It may also involve a wavelet transform.

Each microphone signal $C_i$(i=1 . . . N) obtained from this transformation in the frequency domain may be written as $$X_i(p, \omega_k) = \sum_{n=0}^{M-1} h_a(-n)x_i(pR+n)W_n^{-kn} \tag{18}$$

where k=0 . . . (M−1), and
ha(n)=analysis window of length M,
M=length of analysis window (in number of samples),
R=window shift size (in samples),
p=frame index corresponding to an instant t and of a duration equal to that of M of the analysis window, The frequency axis being uniformly discrete, the following applies to the kth component:

$$\omega_k = 2\pi k/M \ k=0 \ldots (M-1) \tag{19},$$

and $$W_M = e^{j2\pi/M} = e^{j\omega 1} \tag{20}.$$

Be it noted that $\omega_k$ is a discrete representation of frequency f.

The signal Y(p, $\omega_k$) at the output of the antenna ANT is attained by summing, in the summer SOM, the signal $X_i$(p, $\omega_k$) from the microphones C, (i=1 . . . N) respectively subjected to channel filters $FV_i$ of which the transfer function is $a_i(\omega_k)$. Therefore $$Y(p,\omega_k)=\Sigma_{i=1}^{N}a_i(\omega_k)X_i(p,\omega_k). \tag{21}$$

As already cited in the preamble of the present specification and as is understood, each transfer function $a_i(\omega_k)$ includes not only the directivity control function but also the delay compensation function.

The signal Z(p, $\omega_k$) at the output of the post-filtering function W(p, $\omega_k$) carried out in the post-filter W is given by the relation $$Z(p,\omega_k)=Y(p,\omega_k)W(p,\omega_k) \tag{22}.$$

Lastly the antenna system output signal z(n) is obtained by a transform into the time domain, performed by a time domain transform unit UTT. This transform unit UTT for instance comprises an inverse Fourier transform and a windowing operation. It might also be an inverse wavelet transform.

Therefore the signal z(n) is given by the following relation, where n=0 . . . (M−1) and h(n) is the synthesis window of length M:

$$z(n) = \sum_{p=-\infty}^{p=+\infty} h_s(n - pR)\left\{\frac{1}{M}\right\}\sum_{K=0}^{m-1} z(p, \omega_k)W_M^{k(n-pR)} \quad (23)$$

This particular implementing method is part of a group of interference reduction techniques (ambient noise, reverberations, acoustic echoes etc.) using short-term spectral modification. Accordingly processing is by sliding time window. All variants of these approaches may be used to carry out the method of the invention.

The function $W(p, \omega_k)$ of the post-filter is attained by means of the ratio of the antenna output signal power $\hat{p}_y(p, \omega_k)$ to the estimated input signal power $\hat{p}_x(p, \omega_k)$ and therefore can be written as follows $$W(P,\omega_k)=\{\hat{p}_y(p,\omega_k)\}/\{\hat{p}_x(p\omega_k)\} \quad (24).$$

As already mentioned above, linear or non-linear transformations may be applied to the post-filter. Illustratively this may be done to get rid of estimating errors in particular contexts (at the frequencies at which the post-filter assumes values outside a predetermined interval, for instance (0; 1). In that case a threshold limiting function must be applied to preclude undesired amplifications. Again some values close to the maximum value of the post-filter function may be privileged and the values near the minimum value of the post-filter function may be reduced more strongly.

The estimate of the input signal power $\hat{p}_x(p, \omega_k)$ can be carried out in the ESTE unit by means of the average of the spectral power densities of the signals transmitted by the microphones $C_1$ through $C_N$:

$$\hat{P}_x(p, \omega_k) = \sum_{i=1}^{N} \hat{\Phi}_{x_i x_i}(p, \omega_k) \quad (25)$$

Be it borne in mind that in determining this power, only signals from one or certain sensors $C_1$ through $C_N$ can be used.

The estimate of the antenna output signal $\hat{p}_y(p, \omega_k)$ is carried out by the ESTS unit and is determined by estimating the said signal's spectral power density, $$\hat{p}_y(p,\omega_k)=\hat{\emptyset}_{yy}(p,\omega_k) \quad (26).$$

The UC unit calculates the post-filtering function $W(p, \omega_k)$ and feeds it to this very post-filter W.

The spectral density estimates $\hat{\emptyset}_{x_i x_i}(p, \omega_k)$ and $\hat{\emptyset}_{yy}(p, \omega_k)$ are subject to a tradeoff between a long-term estimate offering only slight deviation and quick updating of the post-filter with the function $W(p, \omega_k)$ which must assure follow-up of the time variations of the involved signals.

In illustrative manner a recursive estimating method including exponential forgetting smoothing and thereby assuming such a tradeoff and easily calculated by the recursive equations below is used:

$$\hat{\emptyset}_{xi,xi}(p,\omega_k)=\alpha\hat{\emptyset}_{xi,xi}(p-1, \omega_k)+X_i(p,\omega_k)X^*_i(p,\omega_k) \quad (27)$$

and $$\hat{\emptyset}_{yy}(p,\omega_k)=\alpha\hat{\emptyset}_{yy}(p-1,\omega_k)+Y(p,\omega_k)Y^*(p,\omega_k) \quad (28)$$

where α is a number near 1 and related to the time constant τ of the exponential forgetting smoothing by the following relation $$\alpha=e^{-R/(\tau Fe)} \quad (29)$$

where Fe is the sampling frequency and R is the window shift (in samples).

Be it noted that the sum of the weights of the two terms of the second part of estimate equations above does not equal unity. This may be understood in the light of the post-filter being expressed in a form which allows circumventing the conventional weighting of one of the two terms by (1−α).

The above described method of the invention was carried out using an acoustic antenna designed for interactive communications based on personal computers (PCs). This acoustic antenna is mounted on the monitor of a PC. It consists of 9 cardioid microphones $C_1$ through $C_9$ linearly arrayed over a length of 40 cm. This antenna consists of 4 sub-antennas respectively dedicated to low frequencies, low average frequencies, high average frequencies and high frequencies, namely in the broadened telephone band of 50 Hz–7 kHz.

The first sub-antenna consists of the sensors $C_1$, $C_5$, $C_9$ spaced apart by 20 cm between contiguous sensors. Bandpass filtering characterized by the function $g_j(f)$ filters is applied to the signals each of said sensors.

The second sub-antenna consists of the sensors $C_1$, $C_2$, $C_5$, $C_8$, $C_9$ which are spaced apart by 10 cm between contiguous sensors. Each sensor signal is bandpass-filtered by the function $g_2(f)$.

The third sub-antenna consists of the sensors $C_2$, $C_3$, $C_5$, $C_7$, $C_8$ of which the spacing between contiguous sensors is 5 cm. Each sensor signal is bandpass filtered by the function $g_3(f)$.

The fourth sub-antenna consists of the sensors $C_3$, $C_4$, $C_5$, $C_6$, $C_7$ of which the spacing between contiguous sensors is 2.5 cm. Bandpass filtering characterized by the function $g_4(f)$ is applied to each sensor signal.

It is understood that the microphone $C_1$ which simultaneously is part of the two first sub-assemblies transmits a signal subjected in a channel filter $FV_1$ to a bandpass filtration characterized by the function which is the sum of the two characterizing functions $g_1(t)+g_2(t)$.

Accordingly the channel filters $FV_1$ through $FV_9$ are resp. transfer functions $a_1(t)$ through $a_9(t)$ defined as follows:

$$a_1(t)=a_9(t)=g_1(t)+g_2(t)$$

$$a_2(t)=a_8(t)=g_2(t)+g_3(t)$$

$$a_3(t)a_7(t)g_3(t)+g_4(t)$$

$$a_4(t)=a_6(t)=g_4(t)$$

$$a_5(t)=g_1(t)+g_2(t)+g_3(t)+g_4(t).$$

These filters control the directivity corresponding to acoustic detection for a work station, the antenna being pointed toward the computer screen, the main lobe being constant (−3 dB aperture angle=20°) and the magnitude of the secondary lobes being less than −12 dB relative to the main lobe's maximum.

It is understood that these filters $FV_1$ through $FV_9$ are implemented in the frequency domain in the manner discussed above in relation to FIG. 5.

The performance of an antenna system such as was discussed above will now be described with respect to reducing an acoustic echo. It is assumed that the user of the equipment provided with said antenna system (called the local speaking party) communicates without resort to his hands. The speech from the person he is communicating with—the so-called distant speaking party—is broadcast on a loudspeaker to the right of said computer's monitor. The acoustic echo which must be reduced is the signal picked up by the acoustic antenna and which is produced by the sound from this loudspeaker. This echo is highly interfering because the distant speaking party hears his own speech shifted in time (because of the delay in the telecommunication channel). Once the echo reaches a given level, an unstable but self-sustaining phenomenon known as the Larsen oscillation may occur.

FIG. 6 displays the time-dependent amplitude of the signals at the output of an antenna such as described above but lacking the filtering unit. FIG. 6 shows the useful speech component from the local speaking party in black and in gray it shows the acoustic echo component.

This display shows illustrative system performance, but practically the useful signals and the echo signals are superposed. In this figure the interferences are especially degrading because the two people speak at the same time except for the time interval (2.3 s; 3 s) and the interference and useful source are simultaneously operative. The useful-signal/echo-signal ratio in this experiment is 10.4 dB at the antenna input, this value being measured at the antenna's central microphone.

FIG. 7 shows the same signals as in FIG. 6, however at the above described post-filter output. This figure shows a significant reduction by the post-filter of the echo still present at the antenna output without decreasing the useful signal level. The measured values of useful signal to echo ratio are 10.4 dB at the antenna input, 14 dB at the antenna output, and 21 dB at the post-filter output. Consequently the average gain in the signal-to-echo ratio is 4.6 dB for the antenna and 7 dB for the post-filter, imparting to the system an improvement of 11.6 dB in the signal-to-echo ratio.

FIG. 8 provides information on echo reduction with time. The curves are derived by measuring the energy of signals in blocks of 64 ms. Be it noted that the post-filter significantly increases antenna performance. Moreover, when local speech is absent, namely in the time interval from 2.3 to 3 s, the residual echo at the antenna output is reduced by 20 dB and more by the post-filter.

What is claimed is:

1. A method of improving the power ratio of useful signal to interference signals of an antenna having at least one sensor said method comprising filtering the signal from said antenna using a filter having a transfer function {W(t), W(t, f)} equal to the ratio of linear functions (F) and (G) of the power $\{\hat{p}_y(t), \hat{p}_y(t,f)\}$ at the output of the antenna to the power $\{\hat{p}_x(t), \hat{p}_x(t,f)\}$ at the input of the antenna, namely $$W(t) = \frac{F\{\hat{p}_x(t), \hat{p}_y(t)\}}{G\{\hat{p}_x(t), \hat{p}_y(t)\}} \text{ or }$$

$$W(t, f) = \frac{F\{\hat{p}_x(t, f), \hat{p}_y(t, f)\}}{G\{\hat{p}_x(t, f), \hat{p}_y(t, f)\}}.$$

2. A method of improving the power ratio of the useful signal to interfering signals as claimed in claim 1, wherein the antenna includes plural sensors, said transfer function {W(t), W(t, f)} equals the power ratio of the output signal of the antenna, $\{\hat{p}_y(t), \hat{p}_y(t, f)\}$, to the powers of the signal(s) fed by the respective sensor at the input of the antenna, namely $\{\hat{p}_x(t), \hat{p}_x(t, f)\}$, so that $$W(t)=\{\hat{p}_y(t)\}/\{\hat{p}_x(t)\} \text{ or } W(t,f)=\{\hat{p}_y(t,f)\}/\{\hat{p}_x(t,f)\}.$$

3. A method of improving the power ratio of the useful signal to that of the interfering signals as claimed in claim 2, further including estimating the power $\{\hat{p}_y(t), \hat{p}_y(t, f)\}$ of the output signal of the antenna and the power $\{\hat{p}_x(t), \hat{p}_x(t, f)\}$ of the signal(s) respectively from the sensors at the input of the antenna.

4. A method of improving the power ratio of the useful signal to that of the interfering signals as claimed in claim 3, wherein the estimate of the power $\{\hat{p}_x(t), \hat{p}_x(t, f)\}$ of the signal(s) respectively fed from the sensors to the input of the antenna, is derived from the signal(s) ($x_i(t)$, i=1 through N) respectively fed by the sensor(s) of said antenna.

5. A method of improving the power ratio of the useful signal to that of the interfering signals as claimed in claim 3, wherein the estimate of the power $\{\hat{p}_x(t), \hat{p}_x(t, f)\}$ of the signal(s) respectively fed by the sensor(s) to the input of the antenna is derived from the processed signal(s) from a processing unit TA of said antenna, further signals ($x_i(t)$, i=1 through N) respectively transmitted from the sensors of said antenna.

6. An antenna processing method comprising transforming into the frequency domain a signal transmitted from at least one sensor, filtering the signal resulting from said transformation, summing the respective signals following filtering, and transforming into the time domain the summing signal, wherein said filtering the signal from said antenna is performed with a filter having a transfer function {W(t, f)} equal to the ratio of two linear functions (F) and (G) of the power $\{\hat{p}_y(t, f)\}$ at the output of a summer to the power $\{\hat{p}_y(t, f)\}$ of the output signal(s) resulting from the transformation in the frequency domain:

$$W(t, f) = \frac{F\{\hat{p}_x(t, f), \hat{p}_y(t, f)\}}{G\{\hat{p}_x(t, f), \hat{p}_y(t, f)\}}.$$

7. Antenna processing method as claimed in claim 6, wherein said transfer function {W(t, f)} equals the ratio of the output signal power of the summer (SOM), namely $\hat{p}_y(t, f)$, to output signal(s) power(s) from said transformation units in the frequency domain, namely $\{\hat{p}_x(t, f)\}$:

$$W(t,f)=\{\hat{p}_y(t,f)\}/\{\hat{p}_y(t,f)\}$$

8. Antenna processing method as claimed in claim 7, further including estimating the average of the estimated spectral power densities $\{\hat{\emptyset}_{xi,xi}(t, f)\}$ of the output signal(s) of the sensor(s) as $$\hat{p}_x(t, f) = \sum_{i=1}^{N} \hat{\phi}_{xi,xi}(t, f)$$

to estimate the power $\{\hat{p}_x(t, f)\}$ of the output signal of the particular signal(s) fed by the sensor(s) to the input of the antenna.

9. Antenna processing method as claimed in claim 6, further including estimating the power $\{\hat{p}_y(t, f)\}$ of the output signal of the antenna and the power $\{\hat{p}_x(t, f)\}$ of the signal(s) fed by the sensors to the input of the antenna.

10. Antenna processing method as claimed in claim 9, further including calculating the estimate of the spectral power density $\{\hat{\emptyset}_{yy}(t, f)\}$ of this signal, namely $$\hat{p}_y(t,f) = \hat{\emptyset}_{yy}(t,f)$$

to arrive at an estimate $\{\hat{p}_y(t, f)\}$ of the power $\{\hat{p}_y(t, f)\}$ of the output signal at the summer.

11. Antenna processing method as claimed in claim 9, wherein said estimates are carried out recursively by smoothing with an exponential forgetting factor.

12. Antenna system comprising an antenna including at least one sensor apparatus for improving the useful-signal to interference-signals ratio of said antenna, the apparatus for improving comprising a filter for filtering the output signal of said antenna, the filter having a transfer function $\{W(t), W(t, f)\}$ equal to the ratio of two linear functions (F) and (G) of the power $\{\hat{p}_y(t), \hat{p}_y(t, f)\}$ at the output of the antenna to the power $\{\hat{p}_x(t), \hat{p}_x(t, f)\}$, namely $$W(t) = \frac{F\{\hat{p}_x(t), \hat{p}_y(t)\}}{G\{\hat{p}_x(t), \hat{p}_y(t)\}} \text{ or }$$

$$W(t, f) = \frac{F\{\hat{p}_x(t, f), \hat{p}_y(t, f)\}}{G\{\hat{p}_x(t, f), \hat{p}_y(t, f)\}}.$$

13. System as claimed in claim 12, wherein said transfer function $\{W(t), W(t, f)\}$ of said filter equals the ratio of the power $\{\hat{p}_y(t), \hat{p}_y(t, f)\}$ at the output of the antenna to the power $\{\hat{p}_x(t), \hat{p}_x(t, f)\}$ of the signal(s) respectively fed by the sensor(s) to the input of the antenna, namely $$W(t) = \{\hat{p}_y(t)\}/\{\hat{p}_x(t)\} \text{ or } W(t,f) = \hat{p}_y(t,f)\}/\{\hat{p}_x(t,f)\}.$$

14. Antenna system as claimed in claim 12, further including estimating units for respectively estimating the power $\{\hat{p}_y(t), \hat{p}_y(t,f)\}$ of the output signal of the antenna and processing, and the power $\{\hat{p}_x(t), \hat{p}_x(t,f)\}$ of the signal(s) fed by the said sensor(s) to the input of the antenna.

15. Antenna system as claimed in claim 14, wherein the antenna includes plural sensors, said estimating unit (ESTE), in order to respectively estimate the power $\{\hat{p}_x(t), \hat{p}_x(t,f)\}$ at the input of the antenna is arranged for processing the, more, or all, signals ($x_i(t)$, i=1 . . . N) respectively transmitted by one, or more or all sensors of said antenna in order to estimate the power $\{\hat{p}_x(t), \hat{p}_x(t,f)\}$ at the input of the antenna.

16. Antenna system as claimed in claim 14, wherein in order to estimate the power $\{\hat{p}_x(t), \hat{p}_x(t,f)\}$ at the input of the antenna, said estimating unit is arranged for processing the signal(s) transmitted by an antenna processing unit of said antenna based on signals ($x_i(t)$, i=1 . . . N) respectively transmitted by the sensors of said antenna.

17. Antenna system including a transformation unit to transform the or each signal transmitted by at least one sensor into the frequency domain, the antenna system comprising a channel filter to filter the signal from said transformation unit into the frequency domain, a summer to sum the signals respectively transmitted by said channel filters and a transformation unit for transforming into the time domain the signal at the output of said summer, a filter arrangement coupled to be responsive to the summer for driving the transformation unit for transforming into the time domain, the filter arrangement having a transfer function $\{W(t, f)\}$ equal to the ratio of two linear functions (F) and (G) of the power $\{\hat{p}_y(t, f)\}$ of the output signal of the summer to the power $\{\hat{p}_x(t, f)\}$ of the output signals of said transformation unit into the frequency domain in accordance with $$W(t, f) = \frac{F\{\hat{p}_x(t, f), \hat{p}_y(t, f)\}}{G\{\hat{p}_x(t, f), \hat{p}_y(t, f)\}}.$$

18. System as claimed in claim 17, wherein said transfer function $\{W(t, f)\}$ of said filter arrangement equals the ratio of the power $\{\hat{p}_y(t, f)\}$ of the output signal of the summer to the power $\{\hat{p}_x(t, f)\}$ of the signal(s) transmitted by said transformation unit into the frequency domain, namely $$W(t,f) = \{\hat{p}_y(t,f)\}/\{\hat{p}_x(t,f)\}.$$

19. Antenna system as claimed in claim 17, further including estimating units to respectively estimate the power $\{\hat{p}_y(t, f)\}$ of the output signal of the summer and the power $\{\hat{p}_x(t, f)\}$ of the signal(s) transmitted by said transformation unit for transforming into the frequency domain.

20. Antenna system as claimed in claim 19, wherein said estimating unit is arranged for estimating the power $\{\hat{p}_x(t, f)\}$ of the signals respectively fed by the sensor(s) to the input of the antenna by using the average of the estimates of the spectral power densities $\{\hat{\emptyset}_{xi,xi}(t, f)\}$ of the signals transmitted by the sensors, namely $$\hat{p}_x(t, f) = \sum_{i=1}^{N} \hat{\phi}_{xi,xi}(t, f).$$

21. Antenna system as claimed in claim 19, wherein the estimating unit for estimating the power $\{\hat{p}_y(t, f)\}$ of the output signal of the summer is arranged for indicating the estimate $\{\hat{\emptyset}_{yy}(t, f)\}$ of this signal's spectral power density as $$\hat{p}_y(t,f) = \hat{\emptyset}_{yy}(t,f).$$

22. Antenna system as claimed in claim 19, further comprising a computer arrangement for deriving said estimates recursively by smoothing with an exponential forgetting factor.

* * * * *